US011884002B2

(12) United States Patent
Worsley et al.

(10) Patent No.: US 11,884,002 B2
(45) Date of Patent: Jan. 30, 2024

(54) ADDITIVE MANUFACTURING OF HIERARCHICAL THREE- DIMENSIONAL MICRO-ARCHITECTED AEROGELS

(71) Applicants: Lawrence Livermore National Security, LLC, Livermore, CA (US); Virginia Polytechnic Institute and State University, Blacksburg, VA (US)

(72) Inventors: Marcus A. Worsley, Livermore, CA (US); Xiaoyu Zheng, Livermore, CA (US); Patrick G. Campbell, Livermore, CA (US); Eric Duoss, Livermore, CA (US); James Oakdale, Livermore, CA (US); Christopher Spadaccini, Livermore, CA (US); Ryan Hensleigh, Livermore, CA (US)

(73) Assignees: Lawrence Livermore National Security, LLC, Livermore, CA (US); Virginia Polytechnic Institute and State University, Blacksburg, VA (US)

( * ) Notice: Subject to any disclaimer, the term of this patent is extended or adjusted under 35 U.S.C. 154(b) by 343 days.

(21) Appl. No.: 17/049,934

(22) PCT Filed: Apr. 5, 2019

(86) PCT No.: PCT/US2019/026142
§ 371 (c)(1),
(2) Date: Oct. 22, 2020

(87) PCT Pub. No.: WO2019/209493
PCT Pub. Date: Oct. 31, 2019

(65) Prior Publication Data
US 2021/0237344 A1    Aug. 5, 2021

Related U.S. Application Data

(60) Provisional application No. 62/662,064, filed on Apr. 24, 2018.

(51) Int. Cl.
*B01J 13/00* (2006.01)
*B29C 64/124* (2017.01)
(Continued)

(52) U.S. Cl.
CPC ......... *B29C 64/124* (2017.08); *B01J 13/0091* (2013.01); *B29C 64/30* (2017.08);
(Continued)

(58) Field of Classification Search
CPC ............... G03F 7/0037; B01J 13/0091; B29K 2105/0061; C08J 2205/026
See application file for complete search history.

(56) References Cited

U.S. PATENT DOCUMENTS

| 9,555,583 B1 | 1/2017 | Dirk et al. |
| 2009/0073349 A1* | 3/2009 | Park ...................... G03F 7/0037 |
| | | 430/311 |

(Continued)

OTHER PUBLICATIONS

International Search Report and Written Opinion issued in PCT Application No. PCT/US2019/026142 dated Jul. 2, 2019, 15 pages.
(Continued)

*Primary Examiner* — Khanh T Nguyen
(74) *Attorney, Agent, or Firm* — Foley & Lardner LLP

(57) ABSTRACT

Disclosed here is a method for making a three-dimensional micro-architected aerogel, comprising: (a) curing a reaction mixture comprising a co-sol-gel material (e.g., graphene oxide (GO)) and at least one catalyst to obtain a crosslinked co-sol-gel (e.g., GO hydrogel); (b) providing a photoresin comprising a solvent, a photoinitiator, a crosslinkable polymer precursor, and a dispersion of the crosslinked co-sol-gel (e.g., GO hydrogel); (c) curing the photoresin using projection microstereolithography layer-by-layer to produce a wet gel having a pre-designed three-dimensional structure; (d) drying the wet gel to produce a dry gel; and (e) pyrolyzing the dry gel to produce a three-dimensional micro-architected
(Continued)

aerogel (e.g., graphene aerogel). Also disclosed is a photoresin for projection microstereolithography, comprising a solvent, a photoinitiator, a crosslinkable polymer precursor, and a dispersion of a crosslinked co-sol-gel.

14 Claims, 7 Drawing Sheets

(51) Int. Cl.

| | |
|---|---|
| *B33Y 10/00* | (2015.01) |
| *B33Y 70/00* | (2020.01) |
| *C08K 3/04* | (2006.01) |
| *C01B 32/194* | (2017.01) |
| *C01B 32/198* | (2017.01) |
| *B29C 64/30* | (2017.01) |
| *B33Y 40/20* | (2020.01) |
| *C08F 283/06* | (2006.01) |
| *C08J 9/28* | (2006.01) |
| *B29K 105/00* | (2006.01) |

(52) U.S. Cl.
CPC ............. *B33Y 10/00* (2014.12); *B33Y 40/20* (2020.01); *B33Y 70/00* (2014.12); *C01B 32/194* (2017.08); *C01B 32/198* (2017.08); *C08F 283/065* (2013.01); *C08J 9/286* (2013.01); *C08K 3/042* (2017.05); *B29K 2105/0061* (2013.01); *C01B 2204/22* (2013.01); *C01B 2204/26* (2013.01); *C01B 2204/32* (2013.01); *C01P 2002/82* (2013.01); *C01P 2004/03* (2013.01); *C01P 2006/10* (2013.01); *C08J 2205/026* (2013.01); *C08J 2333/08* (2013.01)

(56) References Cited

U.S. PATENT DOCUMENTS

| | | |
|---|---|---|
| 2012/0034442 A1 | 2/2012 | Pauzauskie et al. |
| 2018/0088462 A1* | 3/2018 | Vyatskikh ................. G03F 7/40 |

OTHER PUBLICATIONS

Zhu et al., "Supercapacitors Based on Three-Dimensional Hierarchical Graphene Aerogels with Periodic Macropores", Nano Letters, vol. 16, No. 6, Jan. 20, 2016, pp. 3448-3456.

* cited by examiner

ADDITIVE MANUFACTURING OF HIERARCHICAL THREE- DIMENSIONAL MICRO-ARCHITECTED AEROGELS

CROSS REFERENCE TO RELATED APPLICATION

This application is a national stage application under 35 U.S.C. § 371 of PCT Application No. PCT/US2019/026142, filed Apr. 5, 2019, which claims priority under 35 U.S.C. § 119(d) to U.S. Provisional Application No. 62/662,064, filed Apr. 24, 2018, the contents of which are hereby incorporated by reference in its entirety.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

Graphene is an atomically thin, two-dimensional (2D) carbon material with exceptional properties including a large specific surface area (2600 m$^2$/g) and impressive electrical conductivity (8000 S/m) all while being one of the stiffest materials ever measured (1 TPa). However, to fully exploit these properties for applications including catalysis, and energy storage, translation of 2D graphene into three-dimensional (3D) structures while maintaining its exceptional properties has been particularly challenging. 3D graphenes (3DGs) largely consist of randomly interconnected sheets with no topological control, resulting in a sharp degradation of mechanical properties compared to pristine graphene, anywhere from a factor of $10^5$ to $10^8$ for elastic modulus (E). Understanding and overcoming this massive loss in mechanical properties is critical for 3DG application and development.

Following Maxwell's stability criterion in cellular structures, 3DG's mechanical degradation arises from their stochastic, bending-dominated cellular layout, carrying load by flexure of the sheets instead of tension and compression. The severity of degradation intrinsically depends on the density (ρ), and follows the proportion, $E \propto \rho^n$, where the scaling factor n for 3DGs is approximately 2.73, worse than stochastic polymer foams with n=2.

3D printing has been utilized to fabricate polymer foams with arbitrary, high-resolution architectures for a variety of advanced applications, and in particular, with stretch-dominated layouts. Stretch-dominated polymer architectures overcome traditional mechanical degradation and scale nearly linearly, n=1.1, with decreasing density. Techniques which utilize 3D printing including extrusion, ice-templating, laser templating, and casting have been used to create 3DGs with moderate structural control. However, they have not been able to achieve a truly arbitrary design space due to limitations in both the printing technique (e.g. toolpath requirement and serial writing) and feedstock materials which are largely not self-supporting. The resulting 3DGs are still limited in design to only a few bending-dominated geometries (wood-pile, square array etc.) and relatively large ligament feature sizes (>100 μm) precluding the vast design freedom to create 3D graphene mesoscale architectures for applications in energy storage and conversion.

This disclosure provides methods of making three-dimensional micro-architected aerogels of graphene or other co-sol-gel materials including graphene oxide (GO), resorcinol formaldehyde (RF), melamine formaldehyde (MF), or a metal organic framework (MOF).

SUMMARY

Disclosed here is a process to create 3D structures with essentially any desired architecture with feature resolutions an order-of-magnitude finer to apply the benefits of micro-architecture to 3D materials. Photocurable graphene oxide (GO) resins that can be sequentially patterned through a light-based 3D printing technique called projection microstereolithography (PμSL) were designed and synthesized. The complex hierarchical 3D micro-architected graphene (MAG) assemblies (FIG. 1) have high surface area and are electrically conductive bringing all the desirable properties of 3DGs to a much broader design space. This ability was utilized to incorporate hierarchical stretch-dominated micro-architectures which mitigate the degradation in mechanical properties with decreasing density. This process enables the fabrication of any designed 3D topologies with interconnected graphene foam as a base material, thereby enabling the use of design principles to incorporate structural hierarchies into the 3DGs. The resulting MAGs are lightweight (FIG. 1), and can be designed and created with intricate 3D topologies having hierarchical structural features from a few microns to hundreds of microns.

One aspect the invention described herein relates to a method for making a three-dimensional micro-architected aerogel (e.g., graphene aerogel), comprising: (a) curing a reaction mixture comprising a co-sol-gel material (e.g., GO) and at least one catalyst to obtain a crosslinked co-sol-gel (e.g., GO hydrogel); (b) providing a photoresin comprising a solvent, a photoinitiator, a crosslinkable polymer precursor, and a dispersion of the crosslinked co-sol-gel (e.g., GO hydrogel); (c) curing the photoresin using projection microstereolithography layer-by-layer to produce a wet gel having a pre-designed three-dimensional structure; (d) drying the wet gel to produce a dry gel; and (e) pyrolyzing the dry gel to produce a three-dimensional micro-architected aerogel (e.g., graphene aerogel).

In some embodiments, the co-sol-gel material is graphene oxide (GO), resorcinol formaldehyde (RF), melamine formaldehyde (MF), or a metal organic framework (MOF).

In some embodiments, the solvent comprises an organic solvent.

In some embodiments, the solvent comprises N,N-dimethylformamide (DMF).

In some embodiments, the photoinitiator is soluble in an organic solvent.

In some embodiments, the photoinitiator comprises phenylbis(2,4,6-trimethylbenzoyl)phosphine oxide (Irg819).

In some embodiments, the crosslinkable polymer precursor comprise a non-aromatic acrylate prepolymer and an aromatic acrylate prepolymer, wherein the crosslinkable polymer precursor accounts for about 12-30 wt. %, or about 12-20 et. %, or about 20-30 wt. % of the photoresin.

In some embodiments, the crosslinkable polymer precursor comprises polyethylene glycol diacrylate (PEGDA) and Bisphenol A ethoxylate (2 EO/phenol) dimethacrylate (BisA-EDMA).

In some embodiments, the catalyst comprises ammonium hydroxide.

In some embodiments, step (a) comprises curing the reaction mixture at a temperature of 100° C. or less.

In some embodiments, step (b) comprises washing the crosslinked co-sol-gel by solvent exchange, dispersing the crosslinked co-sol-gel in the solvent by sonication, and adding the photoinitiator and the crosslinkable polymer precursor to the dispersion of the crosslinked co-sol-gel.

In some embodiments, step (c) comprises curing the photoresin at a wavelength of 500 nm or less.

In some embodiments, step (d) comprises solvent exchange, supercritical drying, and/or freeze drying.

In some embodiments, step (e) comprises pyrolyzing in an inert environment at a temperature of 600° C. or more.

Another aspect the invention described herein relates to a three-dimensional micro-architected aerogel (e.g., graphene aerogel).

In some embodiments, the three-dimensional micro-architected aerogel (e.g., graphene aerogel) has a density of 500 mg/cm$^3$ or less and an electrical conductivity of at least 10 S/m.

In some embodiments, the three-dimensional micro-architected aerogel (e.g., graphene aerogel) has a density of 500 mg/cm$^3$ or less and a surface area of at least 100 m$^2$/g.

In some embodiments, the three-dimensional micro-architected aerogel (e.g., graphene aerogel) has a density of 500 mg/cm$^3$ or less and an elastic modulus of at least 5 MPa.

In some embodiments, the three-dimensional micro-architected aerogel (e.g., graphene aerogel) has a scaling factor of less than 2 based on log-log plot of density versus elastic modulus.

In some embodiments, the three-dimensional micro-architected aerogel (e.g., graphene aerogel) has a first order structure of gyroid lattices, and, optionally, a second order structure of octet-truss lattices.

Another aspect the invention described herein relates to a photoresin for projection microstereolithography, comprising a solvent, a photoinitiator, a crosslinkable polymer precursor, and a dispersion of a co-sol-gel (e.g., GO hydrogel).

These and other features, together with the organization and manner of operation thereof, will become apparent from the following detailed description when taken in conjunction with the accompanying drawings.

DETAILED DESCRIPTION

Figure 1:
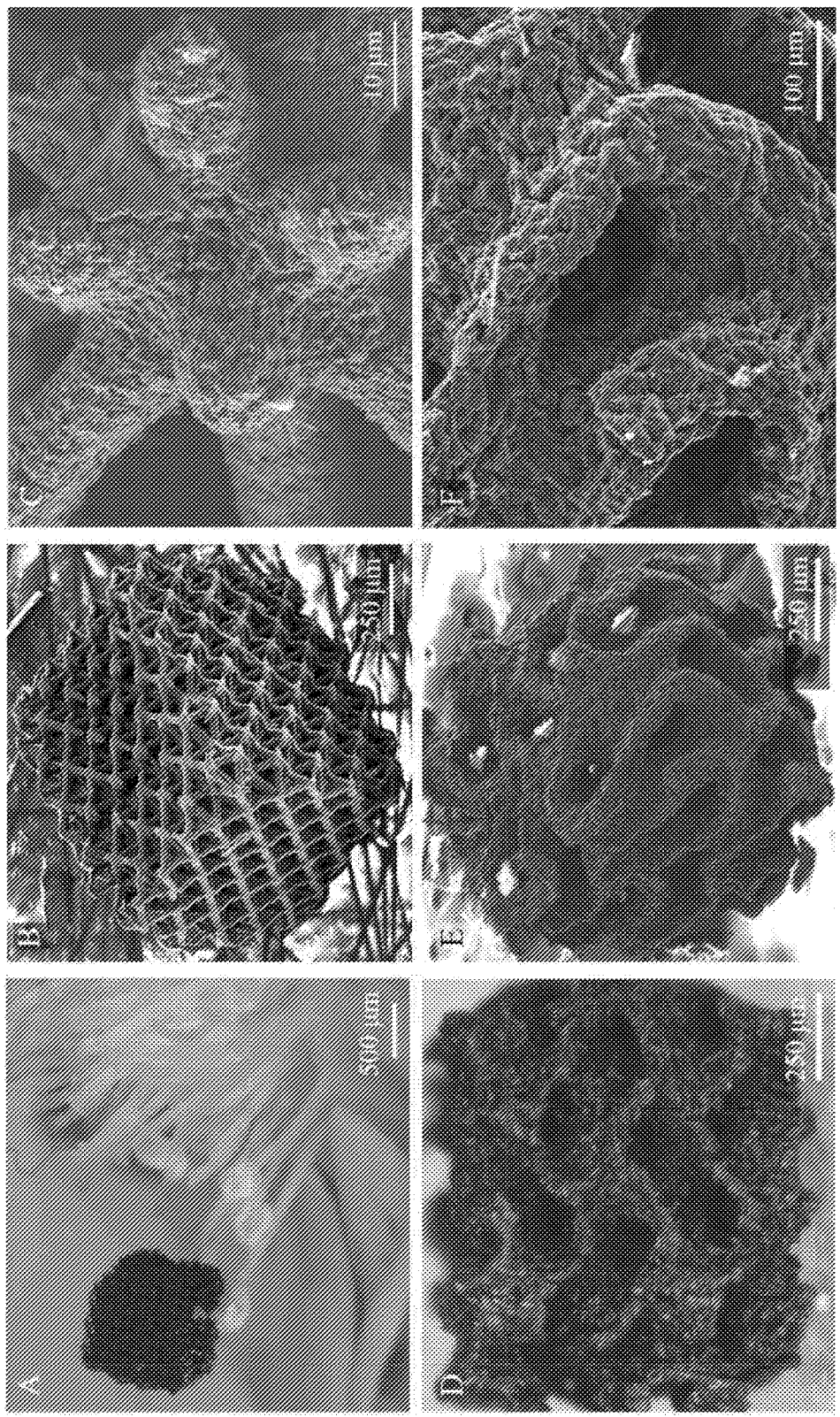
FIG. 1: (A) MAG aerogel supported by a single strawberry blossom filament; (B, C) SEMs of MAGs showing porous nature of the struts; (D, E) Optical and SEM images of MAG gyroid showing intricate overhanging pore structures; (F) Zoomed in image of E showing the porous nature of the walls.

Reference will now be made in detail to some specific embodiments of the invention contemplated by the inventors for carrying out the invention. Certain examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Introduction

Graphene is a two-dimensional material that offers a unique combination of exceptional mechanical properties, large surface area, and excellent electrical conductivity. Its extension into three-dimensional graphene (3DG) foam assemblies, however, has been hampered by significant degradation of these properties particularly when scaling to lower densities. While existing methods have produced 3DGs with limited structural control and minimal feature size over ~100 μm through 3D-printing, no current technique has been able to create graphene with arbitrary, highly connected three-dimensional form factors and micro-scale features to truly bring the benefits of 3D micro-architectures to 3DGs. Herein a light based 3D printing process was developed to rapidly create three-dimensional graphene lattices of essentially any desired structure with graphene strut microstructure having pore sizes on the order of 10 nm. This flexible technique enables printing 3D micro-architected graphenes with complex, high-resolution form factors unparalleled by previous graphene 3D printing techniques. This ability was utilized to demonstrate improved mechanical properties when scaling to lower densities due to control of its three-dimensional hierarchical micro-architecture.

These 3DGs are ultra-light, possess large surface area, and maintain good electrical conductivity, while greatly expanding the micro-architectural design space that 3DGs can realize. This technique is further expandable to other co-sol-gel materials besides those that are graphene based. Examples include resorcinol formaldehyde (RF), melamine formaldehyde (MF), or a metal organic frameworks (MOFs).

The article, "Mechanically Robust 3D Graphene Macroassembly with High Surface Area," Worsley et al., *Chem. Commun.*, 48:8428-8430 (2012), is incorporated by reference in its entirety.

The article, "Toward Macroscale, Isotropic Carbons with Graphene-Sheet-Like Electrical and Mechanical Properties," Worsley et al., *Adv. Funct. Mater.*, 24:4259-4264 (2014), is incorporated by reference in its entirety.

The article, "Synthesis and Characterization of Highly Crystalline Graphene Aerogels," Worsley et al., *ACS Nano*, 8:11013-11022 (2014), is incorporated by reference in its entirety.

US Patent Publication No. 2012/0034442 to Worsley et al., "Graphene Aerogels," is incorporated by reference in its entirety.

US Patent Publication No. 2014/0178289 to Worsley et al., "High-Density 3D Graphene-Based Monolith and Related Materials, Methods, and Devices," is incorporated by reference in its entirety.

US Patent Publication No. 2014/0178759 to Worsley et al., "Graphene-supported metal oxide monolith," is incorporated by reference in its entirety.

US Patent Publication No. 2014/0121425 to Worsley et al., "High surface area graphene-supported metal chalcogenide assembly," is incorporated by reference in its entirety.

US Patent Publication No. 2015/0004087 to Worsley et al., "Crystalline boron nitride aerogels," is incorporated by reference in its entirety.

US Patent Publication No. 2016/0101398 to Worsley et al., "Nanoporous metal-carbon composite," is incorporated by reference in its entirety.

US Patent Publication No. 2017/0036915 to Worsley et al., "Highly Crystalline Graphene Aerogels," is incorporated by reference in its entirety.

US Patent Publication No. 2017/0267925 to Worsley et al., "Monolithic Rare Earth Oxide Aerogels," is incorporated by reference in its entirety.

U.S. patent application Ser. No. 15/073,400 to Worsley et al., "Architected Three Dimensional Graphene Via Additive Manufacturing," is incorporated by reference in its entirety.

Photoresin for Projection Microstereolithography

Many embodiments of the invention described herein relate to a photoresin (i.e., photocurable resin) for projection microstereolithography, comprising a solvent, a photoinitiator, a crosslinkable polymer precursor, and a dispersion of a crosslinked co-sol-gel (e.g., graphene oxide (GO) hydrogel). Co-sol-gel materials may include graphene oxide (GO), resorcinol formaldehyde (RF), melamine formaldehyde (MF), or a metal organic framework (MOF).

Methods for making GO are known in the art and disclosed in, for example, Hummer, *J. Am. Chem. Soc.*, 80:1339 (1958), which is incorporated herein by reference in its entirety. Methods for making melamine formaldehyde are known in the art and disclosed in, for example, Ullah et al., *Journal of the Chinese Chemical Society* 62:2 Feb. 2015. pp 182-190, the entire disclosure of which is incorporated by reference. Metal-organic frameworks (MOFs) are compounds consisting of metal ions or clusters coordinated to organic ligands to form one-, two-, or three-dimensional structures. Examples of MOFs known in the art include $Zn_4O(BTE)(BPDC)$, where $BTE^{3-}$=4,4,4-[benzene-1,3,5-triyl-tris(ethyne-2,1-diyl)]tribenzoate and $BPDC^{2-}$=biphenyl-4,4'-dicarboxylate (MOF-210); $Zn_4O(BBC)_2$, where $BBC^{3-}$=4,4',4"-[benzene-1,3,5-triyl-tris(benzene-4,1-diyl)]tribenzoate (MOF-200); $Zn_4O(BTB)_2$, where $BTB^{3-}$=1,3,5-benzenetribenzoate (MOF-177); $Zn_4O(BDC)_3$, where $BDC^{2-}$=1,4-benzenedicarboxylate (MOF-5); $Mn_3[(Mn_4Cl)_3(BTT)_8]_2$, where $H_3BTT$=benzene-1,3,5-tris(1H-tetrazole); and $Cu_3(BTC)_2(H_2O)_3$, where $H_3BTC$=1,3,5-benzenetricarboxylic acid. MOFs may be prepared according to methods known to the skilled artisan, for example, those in Lee et al., *Korean Journal of Chemical Engineering* September 2013, Volume 30, Issue 9, pp 1667-1680, the disclosure of which is hereby incorporated by reference in its entirety.

In some embodiments, the photoresin is prepared by providing a non-aqueous dispersion of a crosslinked co-sol-gel made by sonicating the crosslinked co-sol-gel in an organic solvent such as DMF, and adding crosslinkable polymer precursor, photoinitiator, and any additional component into the non-aqueous co-sol-gel dispersion. In some embodiments, the photoresin is prepared by providing an aqueous dispersion of a crosslinked co-sol-gel made by sonicating the crosslinked co-sol-gel in deionized water, and adding crosslinkable polymer precursor, photoinitiator, and any additional component into the aqueous co-sol-gel dispersion.

The crosslinked co-sol-gel can be obtained by curing a reaction mixture comprising the co-sol-gel material and at least one catalyst. In some embodiments, the reaction mixture is cured at a temperature of about 25-100° C. (e.g., at about 85° C.). In some embodiments, the reaction mixture is cured for about 4-168 hours (e.g., for at least about 24 hours, or at least about 48 hours, or at least about 72 hours, or at least about 96 hours, such as at a temperature of about 85° C.). In some embodiments, the reaction mixture is cured at atmospheric pressure.

The reaction mixture can comprise a sol-gel catalyst. The sol-gel catalyst can comprise an acid catalyst. The sol-gel catalyst can comprise a base catalyst. Suitable sol-gel catalysts include, but are not limited to, nitric acid, acetic acid, ascorbic acid, hydrochloric acid, sulfuric acid, sodium carbonate, sodium hydroxide, ammonium hydroxide, and calcium sulfate.

In some embodiments, after curing, the crosslinked co-sol-gel is further washed by solvent exchange prior to being dispersed in a solvent. In some embodiments, the solvent exchange functions to remove reaction by-products. Suitable solvent include, but are not limited to, DI water. In some embodiments, the crosslinked co-sol-gel is subjected to solvent exchange to remove water. Suitable solvents include, but are not limited to, acetone. In some embodiments, the crosslinked co-sol-gel is subjected to solvent exchange with a solvent suitable for producing a photocurable resin. Suitable solvents include, but are not limited to, NN-dimethylformamide (DMF).

In some embodiments, after curing and washing, the crosslinked co-sol-gel is mechanically broken up and ultrasonicated to obtain a dispersion of the crosslinked co-sol-gel. In some embodiments, after curing and washing, the crosslinked co-sol-gel is vortexed and/or ball-milled. In some embodiments, the ball-milling is high energy ball-milling or regular ball-milling. The time for sonication can range from about 1-96 hours, or about 3-48 hours, or about 12-24 hours. In some embodiments, after sonication, the dispersion of the crosslinked co-sol-gel comprises largely of particles below 5 µm, with a few larger particles and agglomerates also present.

The concentration of co-sol-gel material in the photoresin can be about 1-50 mg/cc, or about 2-20 mg/cc, or about 5-10 mg/cc. The co-sol-gel material can account for, for example, about 0.2-5 wt %, or about 0.5-2 wt %, or about 1 wt % of the photoresin.

The solvent can comprise, for example, an organic solvent, such as alcohol, dimethylformamide, tetrahydrofuran, ethylene glycol, N-methylpyrrolidone, etc. The solvent can comprise, for example, water. The solvent can comprise, for example, water and at least one organic solvent.

The photoinitiator can be, for example, soluble in an organic solvent such as DMF or alcohol. The photoinitiator can be, for example, soluble in water. The photoinitiator can be, for example, capable of initiating photocuring at a wavelength of 500 nm or less, or 450 nm or less, or 420 nm or less, or 405 nm or less.

In some embodiments, the photoinitiator is a molecule or system of molecules that will have some absorptivity at 405 nm and that once in the excited state will homolytically fragment to generate radicals. The photoinitiator can be selected from LiTPO (lithium phenyl(2,4,6-trimethylbenzoyl)phosphinate), Irgacure 819 (bis 2,4,6-trimethylbenzoyl phenylphosphine oxide), ITX (2-Isopropyl-thioxanthen-9-one), Camphorquinone, Ethyl 4-(NN-diethylamino)benzoate, Irgacure 369 (2-Benzyl-2-dimethylamino-1-(4-morpholinophenyl)-butanone-1), Irgacure 907 (2-Methyl-1-[4-(methylthio)phenyl]-2-(4-morpholinyl)-1-propane), Irgacure 784 (Bis(eta 5,2,4-cyclopentadien-1-yl) bis [2,6-difluoro-2-(1H-pyrrol-1-yl) phenyl]titatnium), or combinations thereof.

The photoinitiator can account for, for example, about 0.5-10 wt %, or about 1-6 wt %, or about 2-4 wt % of the photoresin. The crosslinkable polymer precursor can account for, for example, about 12-30 wt %, or about 12-15 wt %, or about 15-20 wt %, or about 20-30 wt % of the photoresin.

The crosslinkable polymer precursor can comprise, for example, a non-aromatic prepolymer. The non-aromatic prepolymer can be an acrylate, thiol, vinyl, methacrylate, epoxy, or vinyl ether prepolymer. The non-aromatic prepolymer can be, for example, partially or substantially removable by pyrolysis. The non-aromatic prepolymer can be, for example, soluble in an organic solvent such as DMF or alcohol. The non-aromatic prepolymer can be, for example, soluble in water. The non-aromatic prepolymer can be, for example, a polyethylene glycol (PEG) based polymer such as polyethylene glycol diacrylate (PEGDA). The non-aromatic prepolymer can be, for example, pentaerythritol triacrylate (PETA), trimethylolpropane triacrylate (TMPTA), 1,6-hexanediacrylate (HDDA), any polyfunctional (2 reactive groups or greater) acrylate container prepolymers that also soluble in DMF, or combinations thereof.

The crosslinkable polymer precursor can comprise, for example, an aromatic prepolymer. The aromatic prepolymer can be an acrylate prepolymer. In some embodiments, the aromatic prepolymer can react/crosslink upon exposure to UV but will also remain to some extent after the pyrolysis/carbonization step. In some embodiments, the aromatic prepolymer can react/crosslink upon exposure to UV and be fully removed after the pyrolysis/carbonization step. The aromatic prepolymer can be, for example, Bisphenol A ethoxylate (2 EO/phenol) dimethacrylate (BisA-EDMA). The aromatic prepolymer can be, for example, Bisphenol F ethoxylate (2 EO/phenol) diacrylate (BisF). The aromatic prepolymer can be, for example, BPA derivatives, such as bisphenol A glycerolate dimethacrylate, or aromatic urethane acrylates.

In some embodiments, the photoresin comprises both a non-aromatic acrylate prepolymer and an aromatic acrylate prepolymer. The non-aromatic acrylate prepolymer can account for, for example, 1-99 wt %, 10-90 wt %, 20-80 wt %, 30-70 wt %, 40-60 wt %, about 0 wt. %, about 50 wt. %, or about 100 wt. % of the crosslinkable polymer precursor. The aromatic acrylate prepolymer can account for, for example, 1-99 wt %, 10-90 wt %, 20-80 wt %, 30-70 wt %, 40-60 wt %, about 0 wt. %, about 50 wt. %, or about 100 wt. % of the crosslinkable polymer precursor.

In some embodiments, the photoresin comprises a dispersion of a crosslinked co-sol-gel (e.g., GO hydrogel) in DMF, with Irgacure 819, PEGDA and BisA-EDMA further added in the photoresin.

Methods for Making Three-Dimensional Micro-Architected Aerogels

Many embodiments of the invention described herein relate to a method for making a three-dimensional micro-architected aerogel, comprising: (a) curing a reaction mixture comprising a co-sol-gel material (e.g., graphene oxide (GO)) and at least one catalyst to obtain a crosslinked co-sol-gel (e.g., GO hydrogel); (b) providing a photoresin comprising a solvent, a photoinitiator, a crosslinkable polymer precursor, and a dispersion of the crosslinked co-sol-gel (e.g., GO hydrogel); (c) curing the photoresin using projection microstereolithography layer-by-layer to produce a wet gel having a pre-designed three-dimensional structure; (d) drying the wet gel to produce a dry gel; and (e) pyrolyzing the dry gel to produce a three-dimensional micro-architected aerogel (e.g., graphene aerogel).

In some embodiments, the co-sol-gel material is graphene oxide (GO), resorcinol formaldehyde (RF), melamine formaldehyde (MF), or a metal organic framework (MOF).

Projection microstereolithography (PµSL) is a photolithographic additive manufacturing (AM) method whereby a patterned light beam is used to crosslink photoresin and builds an arbitrary three-dimensional object layer-by-layer. The ability of PµSL to build parts across length scales spanning orders of magnitude relatively quickly is unparalleled. Photocurable compositions compatible with photolithographic techniques such as PµSL for making graphene and graphene-based aerogels are neither routine nor conventional in the art.

In some embodiments, the curing step comprises curing the photoresin at a wavelength of 500 nm or less, or 450 nm or less, or 420 nm or less, or 405 nm or less. In some embodiments, the curing step comprises curing the photoresin by UV.

In some embodiments, the wet gel is subjected to solvent exchange to remove reaction by-products. In some embodiments, the wet gel is subjected to solvent exchange with acetone. In some embodiments, the wet gel is subjected to solvent exchange with DI water. In some embodiments, the wet gel is subjected to solvent exchange with ethanol. In some embodiments, the wet gel is subjected to solvent exchange with DMF.

In some embodiments, the wet gel is dried under supercritical condition (e.g., using supercritical $CO_2$). In some embodiments, the wet gel is freeze dried. In some embodiments, the wet gel is dried under ambient temperature and pressure.

In some embodiments, the dry gel is thermally annealed or pyrolyzed in an inert gas (e.g., nitrogen, noble gas such as argon) or a reactive gas (e.g., hydrogen) at a temperature of at least about 600° C., or at least about 800° C., or at least about 1000° C., or at about 1050° C., to produce an architected three-dimensional aerogel. In some embodiments, the dry gel is air annealed.

The pyrolysis may, for example, partially or substantially remove polymer components derived from a non-aromatic prepolymer (e.g., PEGDA). The pyrolysis may, for example, partially or substantially remove polymer components derived from an aromatic prepolymer (e.g., BisA-EDMA). The pyrolysis may, for example, incorporate aromatic components derived from an aromatic prepolymer into the backbone of the GO/graphene matrix.

Three-Dimensional Micro-Architected Aerogels

Many embodiments of the invention relate to an 3D micro-architected aerogel (e.g., graphene aerogel) produced by the method described herein. The aerogel is "architected" in terms of having an arbitrary 3D structure that can be pre-designed as a CAD model and additively manufactured layer-by-layer by projection microstereolithography.

The 3D micro-architected aerogel may comprise a co-sol-gel. The co-sol-gel component can account for, for example, at least about 30 wt %, or at least about 50 wt %, or at least about 70 wt %, or at least about 90 wt % of the 3D micro-architected aerogel.

The 3D micro-architected aerogel can be a monolith having a thickness of, for example, at least about 100 μm, or at least about 1 mm, or at least about 10 mm, or at least about 100 mm, or about 10 μm to about 1 mm, or about 1 mm to about 100 mm.

The 3D micro-architected aerogel can have a density of, for example, about 1 g/cm$^3$ or less, or about 500 mg/cm$^3$ or less, or about 300 mg/cm$^3$ or less, or about 200 mg/cm$^3$ or less, or about 100 mg/cm$^3$ or less, or about 10-500 mg/cm$^3$, or about 20-300 mg/cm$^3$, or about 50-200 mg/cm$^3$.

The 3D micro-architected aerogel can have an elastic modulus of, for example, at least about 2 MPa, or at least about 5 MPa, or at least about 10 MPa, or at least about 20 MPa, or least about 50 Mpa, or at least about 100 MPa, or about 5-500 MPa, or about 10-200 MPa, or 20-100 MPa.

The 3D micro-architected aerogel can have a BET surface area of, for example, at least about 20 m$^2$/g, or at least about 50 m$^2$/g, or at least about 100 m$^2$/g, or at least about 200 m$^2$/g, or about 10-1,000 m$^2$/g, or about 20-500 m$^2$/g, or about 50-200 m$^2$/g.

The 3D micro-architected aerogel can have an electrical conductivity of, for example, at least about 10 S/m, or at least about 20 S/m, or at least about 50 S/m, or at least about 100 S/m, or at least about 200 S/m, or about 10-500 S/m, or about 20-200 S/m, or about 50-100 S/m.

The 3D micro-architected aerogel can have, for example, a first order structure of gyroid lattices. The 3D micro-architected aerogel can have, for example, a second order structure of octet-truss lattices.

The 3D micro-architected aerogel can have, for example, a scaling factor of less than 2.6, or less than 2.4, or less than 2.2, or less than 2.0, or less than 1.8 or less than 1.6, or about 1.2-2.5, or about 1.5 to 2, based on log-log plot of density versus elastic modulus.

The 3D micro-architected aerogel can comprise, for example, a three-dimensional network of graphene sheets interconnected or crosslinked by chemical bonds such as covalent carbon-carbon bonds. In some embodiments, 50% or more, or 70% or more, or 80% or more, or 90% or more of the graphene sheets are directly crosslinked to other graphene sheets. In some embodiments, 50% or more, or 70% or more, or 80% or more, or 90% or more of the graphene sheets are covalently crosslinked. In some embodiments, 50% or more, or 70% or more, or 80% or more, or 90% or more of the covalent bonds interconnecting the graphene sheets are sp$^2$ carbon-carbon bonds. In some embodiments, 20% or less, or 10% or less, or 5% or less of the graphene sheets are interconnected only by physical crosslinks. In some embodiments, 20% or less, or 10% or less, or 5% or less of the graphene sheets are interconnected only by metal crosslinks.

Composites Derivable from Three-Dimensional Micro-Architected Aerogels

Additional embodiments of the invention described herein relate to a composite derived from the 3D micro-architected aerogel (e.g., graphene aerogel).

The composite can comprise, for example, a metal or metal compound deposited or disposed onto the internal surfaces of the 3D micro-architected aerogel. The composite can comprise, for example, a transition metal or metal compound (e.g., transition metal oxide) deposited or disposed onto the internal surfaces of the 3D micro-architected aerogel. The composite can comprise, for example, a post-transition metal or metal compound (e.g., post-transition metal oxide) deposited or disposed onto the internal surfaces of the 3D micro-architected aerogel. The composite can comprise, for example, a rear-earth metal or metal compound (e.g., rear-earth metal oxide) deposited or disposed onto the internal surfaces of the 3D micro-architected aerogel. The composite can comprise, for example, a lanthanide metal or metal compound (e.g., lanthanide metal oxide) deposited or disposed onto the internal surfaces of the 3D micro-architected aerogel. The composite can comprise, for example, an actinide metal or metal compound (e.g., actinide metal oxide) deposited or disposed onto the internal surfaces of the 3D micro-architected aerogel.

The metal or metal compound can be deposited or disposed throughout the entire thickness of the 3D micro-architected aerogel. In some embodiments, the composite comprises a metal nanoparticle deposited or disposed onto the internal surfaces of the 3D micro-architected aerogel. In some embodiments, the composite comprises a metal oxide deposited or disposed onto the internal surfaces of the 3D micro-architected aerogel. In some embodiments, the composite comprises a metal chalcogenide (e.g., a metal sulfide) deposited or disposed onto the internal surfaces of the 3D micro-architected aerogel. In some embodiments, the composite comprises a metal nitride deposited or disposed onto the internal surfaces of the 3D micro-architected aerogel. In some embodiments, the composite comprises a metal carbide deposited or disposed onto the internal surfaces of the 3D micro-architected aerogel. In some embodiments, the composite comprises a metal carbonitride deposited or disposed onto the internal surfaces of the 3D micro-architected aerogel. Methods for depositing the metal or metal compound can be found in U.S. Pat. No. 8,664,143, US Pat. Pub. No. 2014/0121425, US Pat. Pub. No. 2014/0178759, and U.S. Pat. Pub. No. 2016/0101398, each of which is incorporated herein by reference in its entirety.

The composite can comprise, for example, a silicon or boron compound deposited or disposed onto the internal surfaces of the 3D micro-architected aerogel. The silicon or boron compound can be deposited or disposed throughout the entire thickness of the 3D micro-architected aerogel. In some embodiments, the composite comprises a silicon compound (e.g., silicon oxide, silicon carbide, silicon nitride) deposited or disposed onto the internal surfaces of the 3D micro-architected aerogel. In some embodiments, the composite comprises a boron compound (e.g., boron nitride)

deposited or disposed onto the internal surfaces of the 3D micro-architected aerogel. Methods for depositing or deriving the silicon or boron compound can be found in U.S. Pat. No. 8,629,076 and US Pat. Pub. No. 2015/0004087, each of which is incorporated herein by reference in its entirety.

The composite can comprise, for example, a polymer deposited or disposed onto the internal surfaces of the 3D micro-architected aerogel. The polymer can be deposited or disposed throughout the entire thickness of the 3D micro-architected aerogel. In some embodiments, the composite comprises polydimethylsiloxane or epoxy deposited or disposed onto the internal surfaces of the 3D micro-architected aerogel. Methods for depositing the polymer can be found in U.S. Pat. No. 9,087,625, which is incorporated herein by reference in its entirety.

In some embodiments, the composite can comprise carbon nanotubes (CNTs), which can improve electrical conductivity, strength, and/or surface area of the material.

Applications

The 3D micro-architected aerogel described herein exhibit exceptional conductivity and surface area, which with the flexibility of the PuSL printing technique makes them suitable materials for supercapacitors, sensors, catalysts, catalyst supports, batteries, sorbents, filtration/separation, capacitive desalination, hydrogen storage, electrocatalysis, biocatalysis, and tissue scaffolds of custom designed architectures and geometries.

WORKING EXAMPLES

Example 1—Materials and Methods

Materials. All materials were used as received. Graphene oxide (GO) was purchased from CheapTubes (single layer 1-20 um). Dimethylformamide (DMF, 99.8%), Bisphenol A ethoxylate (2 EO/phenol) dimethacrylate (BisA-EDMA) with an average molar mass of $M_n$ ~484, polyethylene glycol diacrylate $M_n$ ~700 (PEGDA700), ammonium hydroxide (28-30% in water), and phenylbis(2,4,6-trimethylbenzoyl) phosphine oxide (Irg819) were purchased from Sigma-Aldrich.

Preparation of Photocurable Graphene Aerogel Resin. In a typical FGO resin preparation, 0.2 g of GO, was thoroughly dispersed in 20 g of DMF using a VWR Scientific Model 75T Aquasonic (sonic power ~90 W, frequency ~40 kHz) sonicator for 24 h. To the dispersed FGO, 1.2 g PEGDA700, 1.2 g BisA-EDMA, and 0.8 g Irg819 was added to make the FGO resin. For the XGO resin, 0.2 g GO was dispersed by ultrasonication in deionized water (20 g). GO crosslinking was catalyzed by 3.6 g of ammonium hydroxide (0.18 g/l g GO dispersion) while heating at 80° C. for 96 h following previous reports. After the reaction, the XGO hydrogel was washed by gently decanting and adding fresh deionized water, at least 3× for 12 h each until neutral pH. The XGO hydrogel was then exchanged with acetone, twice for 12 h, and finally with DMF twice for 12 h. Approximately 20 mL of solvent was used for each exchange, except the final DMF exchange which was set at 20 g for the final concentration (1 wt % or 10 mg/g of GO/DMF). The XGO hydrogel in DMF was broken up with a spatula to 1 to 5 mm diameter pieces, and then ultrasonicated for 24 h. To the XGO dispersion 1.2 g PEGDA700, 1.2 g BisA-EDMA, and 0.8 g Irg819 were added to make the XGO resin.

Three-Dimensional Printing of Graphene Aerogel. To print structures, a custom built system equipped with a 405 nm light source was used. A three-dimensional CAD model was sliced vertically into a series of layers. Using a spatial light modulator (SLM) as a dynamically reconfigurable digital photomask, each two-dimensional image slice was sequentially transmitted to the SLM which takes on the pattern of the image. Near-UV light illuminated the SLM from a photodiode, and a patterned beam was reflected. The patterned beam was reflected by a galvanometer mirror pair onto the photoresin. Where the two-dimensional image hit the resin, the material crosslinked and solidified. Subsequently, the substrate on which the layer rests as lowered, thus reflowing a thin film of liquid over the cured layer. The image projection was then repeated, with the next image slice forming the subsequent layer. Parts of differing relative densities were made by varying the light exposure time of the parts, effectively producing parts with varying strut thicknesses.

Bulk Sample Preparation. Bulk samples for porosimetry were prepared by sandwiching the photocurable resin between glass slides with a small, ~0.5 mm spacer and curing in a broad spectrum light box (ELC-500) for 4 min on each side.

Drying and Carbonization. After printing, the resulting green gels were washed in DMF with sonication for a few min They were then soaked in acetone for 24 h to remove all the DMF, exchanging the acetone several times. The wet gels were subsequently dried with supercritical $CO_2$ (Electron Microscope Sciences, EMS3100) for 24 h. For freeze-drying, green gels were washed in DMF with sonication for a few min They were then rinsed with ethanol several times (a few mL for ~1 min) to remove DMF, and then soaked in water for 24 h, before freezing at -20° C. These frozen samples were lyophilized on a VWR lyophilizer for 24 h.

Samples were pyrolyzed at 1050° C. under a $N_2$ atmosphere for 3 h, ramping up and down from room temperature at 1° C. per minute. The graphene aerogel materials were isolated as black 3D carbon structures.

Characterization. Surface area was analyzed by Brunauer-Emmett-Teller nitrogen porosimetry using ASAP 2000 Surface Area Analyzer (Micrometrics Instrument Corporation). Samples from 0.05 to 0.1 grams were put under vacuum ($10^{-5}$ Torr) and heated at 150° C. for 24 h to remove adsorbed species before testing.

Micro-Raman was done using a Renishaw inVia spectrometer with a 50× Leica objective and a 514 nm 9 mW $Ar^+$ laser.

Mechanical Testing. Samples were tested in an Instron 5944 using standard flat compression plates (T1223-1022) and 500N load cell. Each sample was run through 5 cycles, at 2% strain each cycle, with a strain rate of 0.01% strain/min Samples were tested on the [010] face, i.e. perpendicular to the build direction, to avoid support material which could lower the modulus. Data was extracted over less than 10% of the total loading or unloading curve, typically from the second or third cycle, to assure the Instron plate was fully attached to the sample. If the Z direction of a Cartesian coordinate system is the build direction, then the average X and Z of the lattice were determined by optical microscopy and used as the cross-sectional area, while the Y of the lattice was used as the length of the sample to calculate percent strain.

Conductivity. Conductivity was measured by first coating a XGO MAG by sputtering palladium on two opposite faces of the lattice. The resistance from these faces were measured by a multimeter, and converting to conductivity using the measured distance between contact points. This is a simplified approximation, as the pathways in the lattices tested are actually longer than the direct distance measured.

Scaling. The relative density was measured by optical microscopy and previously derived formulas for bend-dominated pyramidal lattices and stretch-dominated octet truss lattices. These relative densities are only approximations, and for octet-truss the accuracy of the approximation depends on the relative density (RD). For lattice with RD less than 20%, the following formula was used where r is the radius of the strut, and 1 is the node-to-node length of the strut. A node is the intersection of struts.

$$RD = 6\sqrt{2}\pi\frac{r^2}{l^2}\left(1 - \frac{8r}{9l}\right)$$

If the RD was greater than 20% using this formula, the following formula was used.

$$RD = G\sqrt{2}\pi\frac{r^2}{l^2} - \left(\frac{16}{3}\right)\sqrt{2}\pi\frac{r^3}{l^3}$$

Multiple measurements of the diameter and length were taken for each structure by optical microscopy before mechanical testing. The radius of the strut was calculated as half the diameter. The standard deviation of these measurements were used to calculate the error in relative density.

The RD fundamentally is density of the structure divided by density of equivalent solid $$RD = \frac{\rho}{\rho_s}$$

To calculate absolute density, the density of a solid was multiplied by the calculated RD of the lattice. The solid was a 3D printed cube of the XGO resin, whose volume was calculated from its dimensions using optical microscopy, and mass was determined using multiple averaged measurements of a VWR electronic balance. The absolute density of a set of lattices were also tested by XP24, Mettler Toledo ultra-microbalance, and the results were within error for the method.

Theoretical prediction of Young's modulus of the graphene lattices. To describe the density dependency of the Young's modulus of the graphene lattices, the graphene lattices was break down into two length-scale hierarchies. On the microscale (first order structure), graphene can be modeled as a gyroid lattice. On the macroscale (second order structure), the graphene lattices: has a geometry called octet-truss lattice structure. By extending the analysis presented by Lakes[6] for elasticity of hierarchical materials, a scaling model was proposed for the stiffness of the graphene lattices. Each scale level n=[0, 1, 2 . . . N] within an N order hierarchical structure can be represented by effective material properties dependent upon the order below it, where the n=C level is the base solid material with a Young's Modulus $E_z$.

The relative density of a hierarchical lattice with total number of hierarchy n is given by:

$$\overline{\rho} = \prod_{1}^{n} \overline{\rho}_{i-(i-1)} \quad (1)$$

where $\overline{\rho}_{i\text{-}(i-1)}$ is the relative density of material made up of the $i^{th}$ hierarchical level. For the graphene lattices shown in this work (N=2), the relative density can be written as, $$\overline{\rho}_{2\text{-}0}=\overline{\rho}_{2\text{-}1}\overline{\rho}_{1\text{-}0} \quad (2)$$

For the first order structure (gyroid), the effective Young's modulus is, $$E_{1\text{-}0}=A(\overline{\rho}_{1\text{-}0})^{N_1}E_s \quad (4)$$

where A, α are geometrical constants for gyroid lattices.

For second order structure (octet), the effective Young's modulus is, $$E_{2\text{-}1}=B(\overline{\rho}_{2\text{-}1})^{N_2}E_{1\text{-}0} \quad (5)$$

where B, β are geometrical constants for octet-miss lattices.
Here $N_1$—2.7 (Gyroid), $N_2$—1.1 (Octet)

Substitute Eq. (4) into Eq. (5), the elastic modulus of the hierarchical graphene lattices becomes, $$E_{2\text{-}0}=AB(\overline{\rho}_{2\text{-}1})^{N_2}(\overline{\rho}_{1\text{-}0})^{N_1}E_z \quad (6)$$

By combining Eq. (2) and Eq. (6), the relationship between the relative density and elastic modulus of the hierarchical graphene lattices can be modified to, $$\left(\frac{E_{2-0}}{E_R} \sim (\overline{\rho}_{2-0})\right)^{aN_2+bN_2}$$

where a and b quantify the contribution of the relative density change of the first and second order structure to the overall scaling, and satisfy the following relationship.

$$a = \frac{\ln\overline{\rho}_{1-0}}{\ln\overline{\rho}_{2-0}},$$

$$b = \frac{\ln\overline{\rho}_{2-1}}{\ln\rho_{2-0}},$$

$$(a + b = 1)$$

In the experiments, the variation range is much larger than $\overline{\rho}_{2\text{-}1}$ is much larger than $\overline{\rho}_{1\text{-}z}$, which means b>>a. So the scaling of the effective elastic modulus of the graphene lattices is closer to $N_2$.

Example 2—Results and Analysis

Figure 2:
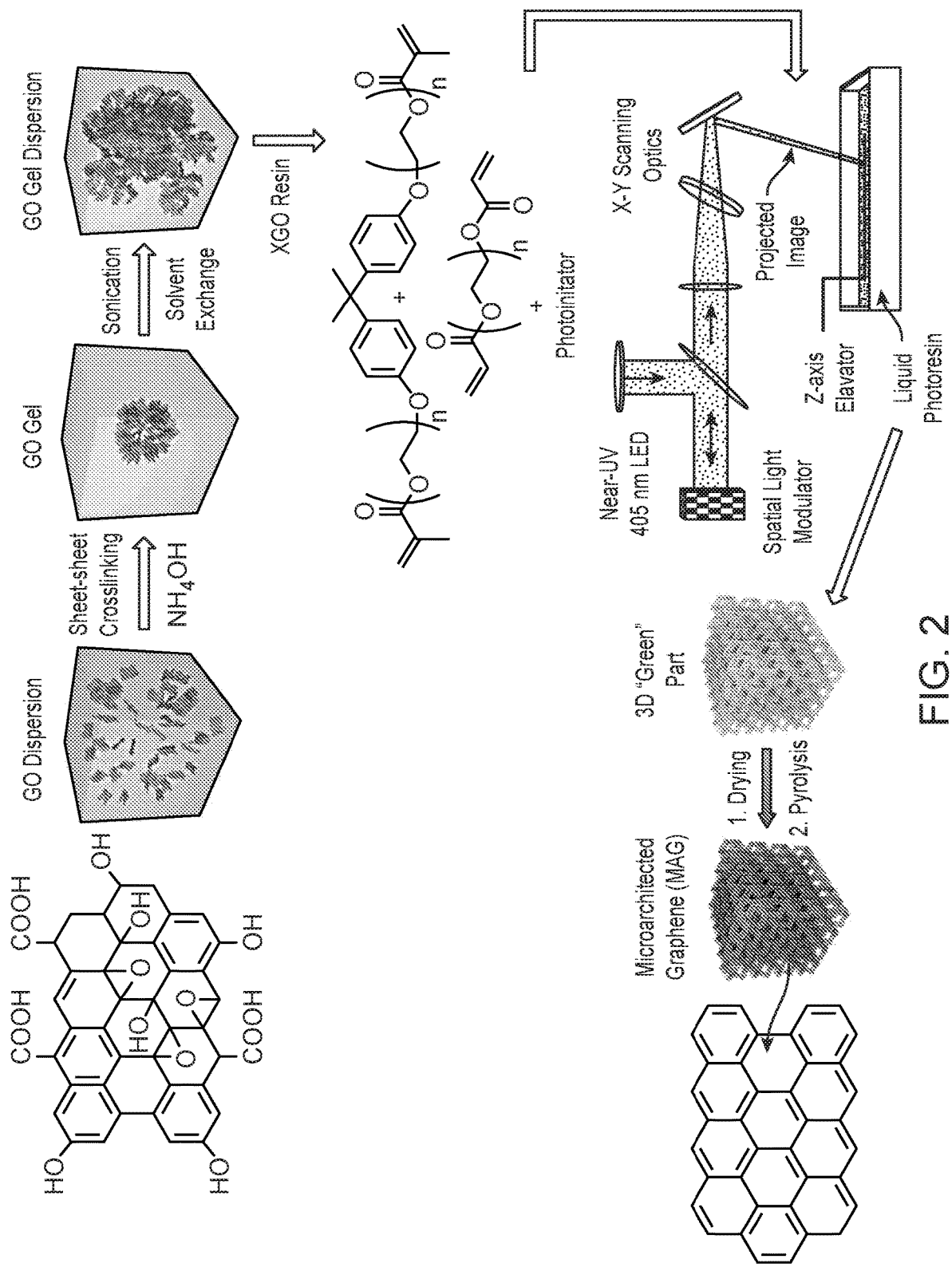
FIG. 2: Scheme of resin synthesis. GO is first crosslinked (XGO) into a hydrogel monolith then dispersed by sonication into a gel fragment dispersion. The addition of acrylates and photoinitiator creates the "XGO resin" and allows PuSL 3D printing, followed by drying and pyrolysis to the final micro-architected graphene (MAG).
Figure 5:
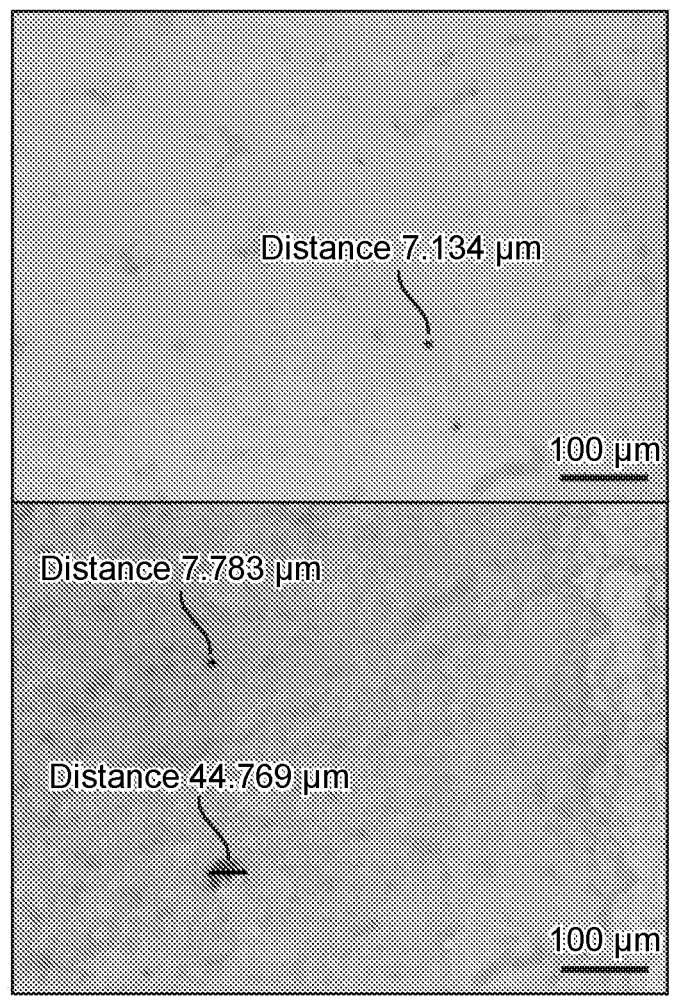
FIG. 5: Optical microscopy of XGO showing most of the hydrogel monolith has been broken down into sub 10 micron particles, with a few agglomerations on the order of 10-50 microns.
Figure 6:
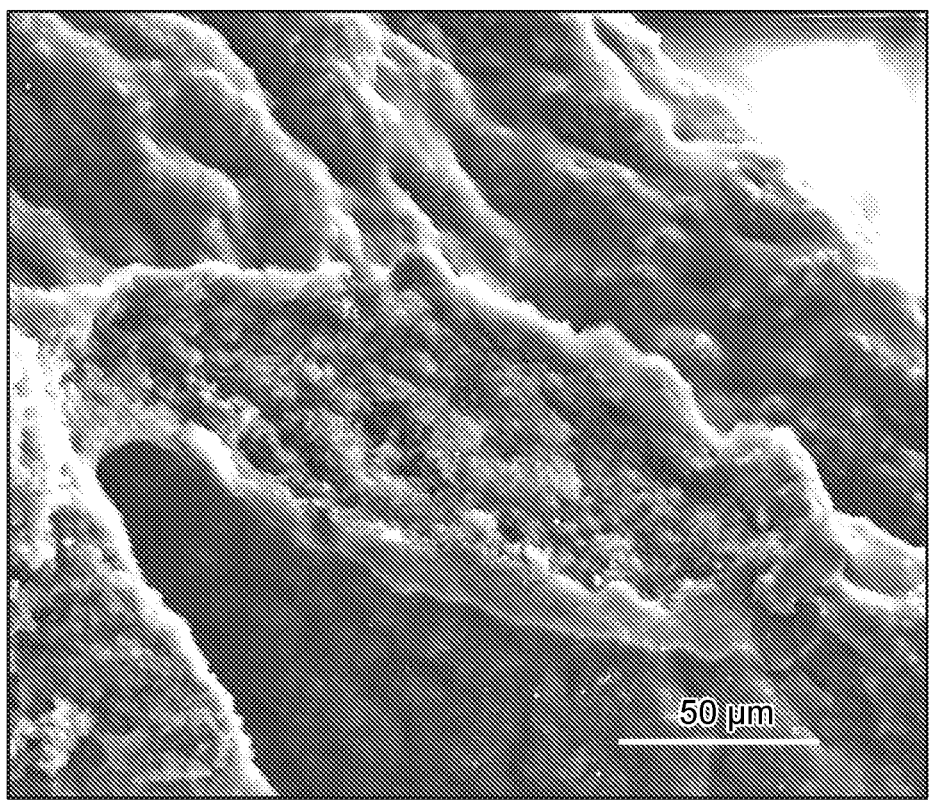
FIG. 6: SEM of FGO with greater than 20 wt % photopolymer showing the excessive amorphous carbon filling the pores of the 3DGs.

The main challenge to realizing MAGs was the development of a photocurable resin that i) rapidly solidifies by light-initiated polymerization, ii) has strong light absorption to maintain small (μm-scale) layer thicknesses, and iii) sufficiently low viscosity to allow dipping and recoating for its layer-by-layer processing (FIG. 2). The resin developed here is a dilute (1 wt %) graphene oxide (GO) dispersions in concert with a dilute amount of photocurable acrylates (12 wt %) and photoinitiator (2 to 4 wt %). It is called "XGO resin" as it consists of crosslinked GO particles (XGO) made by ultrasonically dispersing a GO hydrogel monolith. It was presumed that crosslinking GO in the XGO resin would lead to a MAG with textural properties (e.g. surface area) more similar to traditional aerogels than simply using neat GO flakes. The acrylates and initiator allow PμSL printing by forming a temporary "green" structure that traps the XGO in the desired 3D architecture. The majority of the resin is solvent, NN-dimethylformamide, DMF, as it maintains high quality GO dispersions, and solubilizes most acrylates and the photoinitiator. The addition of DMF eliminates excessive amorphous carbon which could otherwise be introduced by using neat acrylates. The green structures are kept in solvent until dried either by supercritical or freeze-drying processes to maintain surface area. Pyrolysis of the "green" structures removes the majority of the photopolymer and reduces the GO green structure into a MAG The GO concentration was selected to meet the viscosity requirements for PuSL printing and appropriate light absorption for high resolution printing. Optical microscopy of XGO revealed that after 24 hours of sonication, the dispersion consists largely of particles below 5 µm, with a few larger particles and agglomerates also present, (FIG. 5). The acrylic photopolymers, bisphenol A ethoxylate dimethacrylate (BisA-EDMA), and polyethylene glycol diacrylate (PEGDA700), were chosen through empirical tests. Using only BisA-EDMA at 12 wt % produced a macroscopically brittle dust, while using only PEGDA700 produced a weak, solvent-logged gel. Equal amounts of each provided a relatively robust material considering the low overall amount of polymer. Increasing photopolymer concentration above 20 wt % created excessive carbon filling the voids between the graphene sheets. (FIG. 6). Therefore, a polymer concentration of 12 wt % was established as the minimum required to print 3D structures.

MAG's hierarchical morphology was investigated through scanning electron microscopy (SEM). There is an approximate 30-50% shrinkage in feature size due to polymer burn off and densification which is consistent with the expected uniform shrinkage of the printed structure. We have been able to attain high-resolution features with smallest MAG features sizes on the order of 10 µm (FIG. 1C), an order-of-magnitude finer than previous state-of-the-art 3D printed graphene aerogels whose finest features sizes are on the order of 100 µm. Importantly these structures maintain their printed architecture and integrity through the pyrolysis process (FIG. 1).

Figure 3:
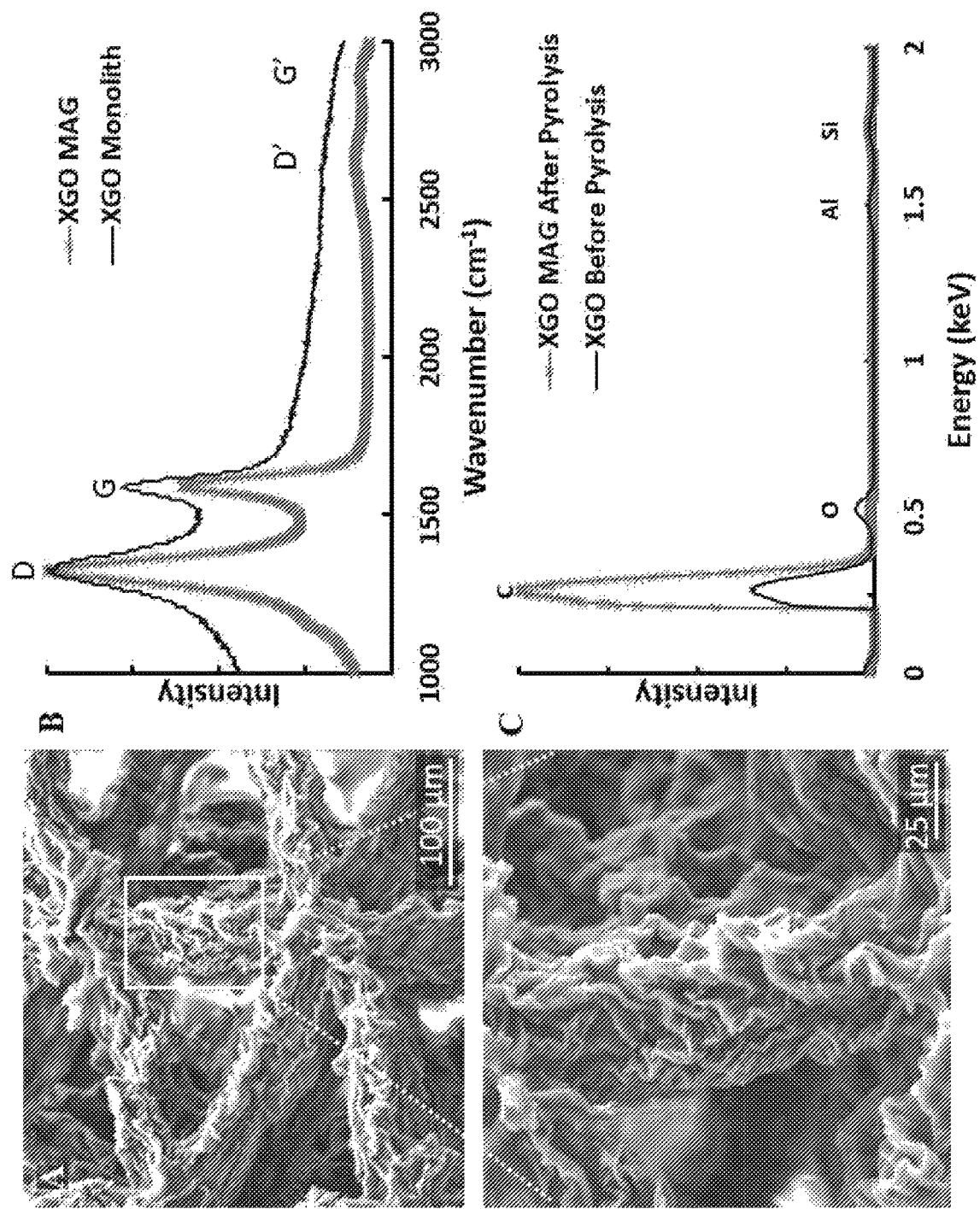
FIG. 3: (A) Microstructure of XGO MAG strut showing the porous nature and wrinkled graphene sheet morphology. (B) Micro-Raman analysis of XGO MAG and XGO monolith with no polymer showing their similar aerogel structure. (C) SEM-EDS of XGO with no polymer before annealing, showing highly oxidized nature, compared to the furnace treated XGO MAGs revealing total loss of acrylate, and GO reduction leaving largely pure graphene network within the MAG struts.
Figure 7:
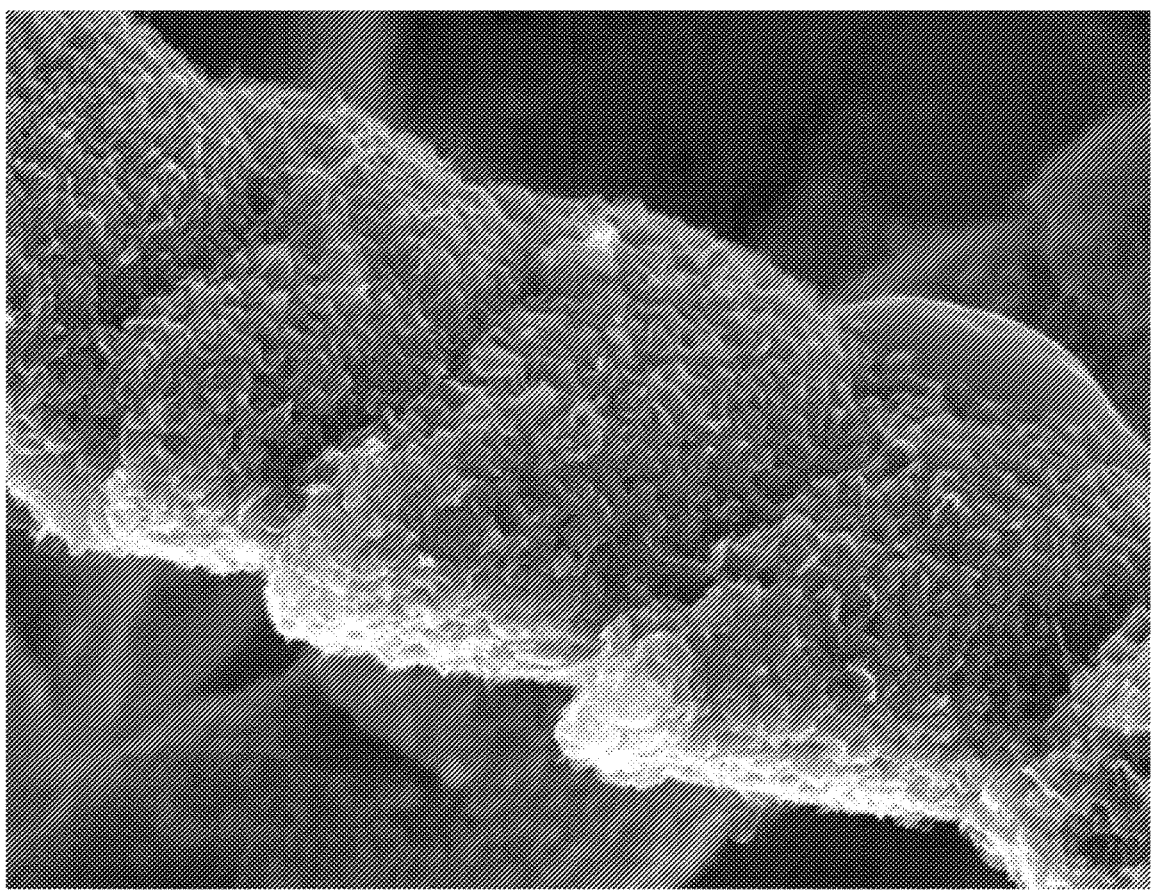
FIG. 7: FGO MAG strut showing the small pore structure with lower surface area (47 m$^2$/g) compared to XGO with (130 m$^2$/g).

FIG. 3 shows the microstructure of an XGO MAG with the expected wrinkled sheet-like morphology and pores consistent with traditional graphene aerogels. XGO exhibits markedly more pore structure than samples using neat flake GO (FGO, FIG. 7), providing evidence that the GO crosslinks survive pyrolysis and help form the 3DG structure within the MAG struts. XGO also has much higher surface area (130 m$^2$/g) than FGO (47 m$^2$/g) due to the pre-crosslinked GO, and fine pores. The porous nature of these MAGs and their large surface areas are consistent with other reported monolith and 3D printed 3DGs, though with an order-of-magnitude finer resolution and far more intricate architecture.

To further investigate the microstructure of the as-fabricated MAGs from the light sensitive resins, Raman Spectroscopy was performed on an XGO MAG, and an XGO monolith aerogel without photopolymer (FIG. 3B). There are four peaks of concern for carbons, the G band (1582 cm$^{-1}$) and D band (1350 cm$^{-1}$), and their overtone G' (3248 cm$^{-1}$) and D' (2700 cm$^{-1}$) bands. The XGO aerogel monolith is typical of many 3DGs, exhibiting strong, broad G and D band peaks due to the many flake edges, and no noteworthy D' or G' peaks from the lack of well-ordered graphite-like layers. The XGO MAG spectra is nearly identical, indicative of porous, aerogel structure within the struts. The lower G band intensity of XGO MAG indicates a decrease in graphene sheet restacking compared to the monolith.

The elimination of acrylate and reduction of XGO were confirmed via SEM energy dispersive X-ray spectroscopy (EDS) (FIG. 3C). XGO dispersions with no polymer were dried via vacuum and compared to freeze-dried and annealed XGO MAGs. Dried XGO showed an atom percentage (at %) of 20 at % for oxygen, typical for the highly oxidized nature of the GO precursor. After pyrolysis, XGO MAGs reveal a significant loss in oxygen to 5 at %, which is very similar to previous reports of XGO monoliths. This is indicative of the reduction of GO and burnout of the majority of the acrylate during furnace treatment to leave a largely pure graphene network within the MAG struts.

Figure 4:
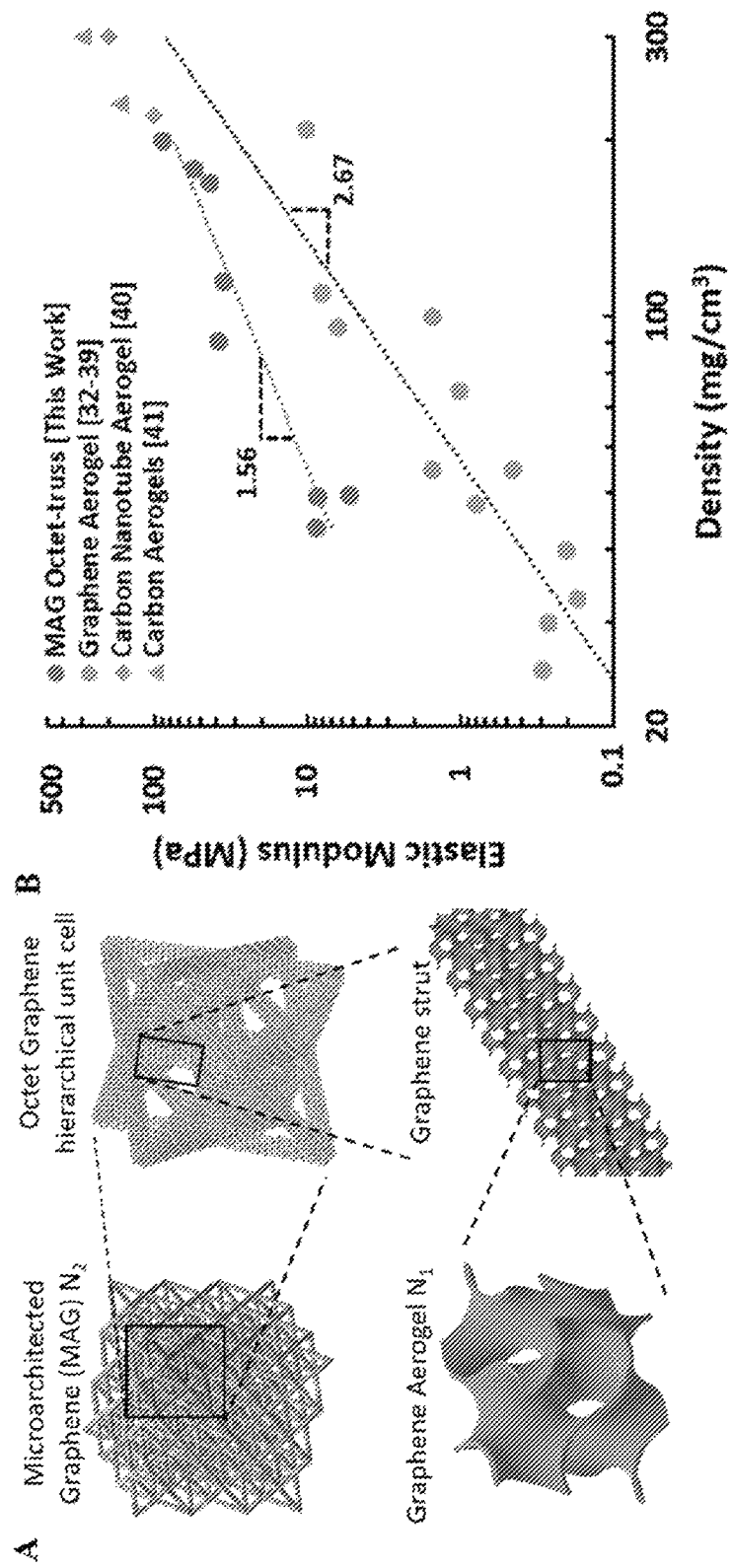
FIG. 4: (A) Schematic of the hierarchical structure of MAGs showing the octet-truss structure with the graphene having an approximated gyroid structure within the struts. (B) Scaling of MAG Octet-truss density with Young's modulus. Most 3DGs, and other carbon and CNT aerogels, exhibit a stiffness degradation of density to the power ~2.67, while MAGs exhibit a lower degradation scaling factor of 1.56 due to their stretch-dominated octet-truss architecture.

The ability to assemble graphene sheets into complex, three-dimensional architectures opens up new opportunities to incorporate designed topologies into 3D graphene assemblies. This ability was utilized to test architectural effects in 3DGs mechanical degradation by printing a class of octet-truss graphene lattice from 9-42% relative density and conducting uni-axial compression tests. The octet-truss is a stretch-dominated micro-architecture, satisfying Maxwell's Criterion, and has previously been demonstrated in polymer, ceramic, and metallic systems to provide exceptionally high elastic moduli at decreasing densities. The octet-truss MAGs represent a hierarchical structure (FIG. 4A), consisting of the porous graphene foam within the overall octet-truss struts. The graphene foam can be approximated as a gyroid, with an average pore diameter of 60 nm (Barrett-Joyner-Halenda method)

The octet-truss MAGs are compared to previously reported graphene, carbon nanotube (CNT), and carbon aerogels on a log-log plot of density versus elastic modulus. The hierarchical MAGs exhibit a scaling factor of n=1.56 (FIG. 4B), significantly improved over that of 3D porous carbon materials including graphene with n~2.67. It is also superior to previous 3D printed graphene aerogels, which due to material and printing limitations, could only achieve bend-dominated structures with scaling similar to that of bulk graphene aerogels (n=2.5).

Unstructured porous graphene aerogels have an architecture which can be represented by a gyroid (n=2.73) deforming by mechanically inefficient flexure or bending of the sheets. The superior scaling of MAGs is a direct result of the beneficial hierarchical 3D architecture, confining the graphene gyroid, to the lowest level of hierarchy, with the second order stretch-dominated octet-truss providing sheet alignment, to cause predominate deformation by mechanically efficient in-plane tension and compression. The mechanical property and density scaling of the second order 3D architected graphene lattice can be approximated as (derivation in SI):

$$E/E_s \sim (\bar{\rho})^{\alpha N_1 + (1-\alpha) N_2}$$

where $N_1$ is the scaling power of the first order c graphene, is the scaling constant of the second order octet-truss architecture, and $\alpha$ represents the variation of the single order architecture relative density to the overall density. Tuning the density ($\bar{\rho}$) of the hierarchical 3D MAGs by primarily reducing the relative density of the octet micro-architecture enables a superior scaling constant closer to the octet lattice architecture as compared to unstructured graphene aerogel.

The incorporation of microarchitecture gives rise to new property scaling law not seen in graphene aerogels. Improved mechanical scaling is just one potential utilization. MAG's huge design space, high surface area and electrical conductivity (64 S/m for a density of 92 mg/cm$^3$) opens the desirable properties of 3DGs to many new possible applications with designed mesoscale architectures in the burgeoning areas of catalysis, energy storage, and separations for which 3DGs hold immense promise.

The working examples demonstrate an efficient pathway to optically print 3D graphene aerogels with complex, hierarchical 3D architectures of interconnected, wrinkled graphene sheets. The photo-activated graphene oxide resin can be precisely patterned by light into any desirable shape with 3D spatial features sizes of ~10 micron, and the strut microstructure having pore sizes on the order of 10 nm. The method can be utilized by any lithographic based technique to open new opportunities for complex free-form 3D graphene assemblies. 3DG fabrication has been limited to relatively simple structure due to intrinsic limits in the manufacturing techniques. The high-resolution, intricate structures demonstrated here not only allow the fabrication of arbitrary form factors for a plethora of applications but can improve graphene foam properties at increasingly low densities. MAG's essentially unlimited design space, high surface area and electrical conductivity paves the way for exploring mesoscale architectures for advanced 3DG applications including catalysis and separation platforms, tunable thermal conductivity, and fluid flow among others.

As used herein, the singular terms "a," "an," and "the" include plural referents unless the context clearly dictates otherwise. Thus, for example, reference to a molecule can include multiple molecules unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

In the foregoing description, it will be readily apparent to one skilled in the art that varying substitutions and modifications may be made to the invention disclosed herein without departing from the scope and spirit of the invention. The invention illustratively described herein suitably may be practiced in the absence of any element or elements, limitation or limitations, which is not specifically disclosed herein. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention. Thus, it should be understood that although the present invention has been illustrated by specific embodiments and optional features, modification and/or variation of the concepts herein disclosed may be resorted to by those skilled in the art, and that such modifications and variations are considered to be within the scopes of this invention.

What is claimed is:

1. A method for making a three-dimensional micro-architected aerogel, comprising:
   (a) curing a reaction mixture comprising a co-sol-gel material and at least one catalyst to obtain a crosslinked co-sol-gel, wherein step (a) comprises curing the reaction mixture at a temperature of 100° C. or less;
   (b) providing a photoresin comprising a solvent, a photoinitiator, a crosslinkable polymer precursor, and a dispersion of the crosslinked co-sol-gel;
   (c) curing the photoresin using projection microstereolithography layer-by-layer to produce a wet gel having a pre-designed three-dimensional structure;
   (d) drying the wet gel to produce a dry gel; and
   (e) pyrolyzing the dry gel to produce a three-dimensional micro-architected aerogel.

2. The method of claim 1, wherein the co-sol-gel material is graphene oxide (GO), resorcinol formaldehyde (RF), melamine formaldehyde (MF), or a metal organic framework (MOF).

3. The method of claim 1, wherein the solvent comprises an organic solvent.

4. The method of claim 1, wherein the solvent comprises N,N-dimethylformamide (DMF).

5. The method of claim 1, wherein the photoinitiator is soluble in an organic solvent.

6. The method of claim 1, wherein the photoinitiator comprises phenylbis(2,4,6-trimethylbenzoyl)phosphine oxide (Irg819).

7. The method of claim 1, wherein the crosslinkable polymer precursor comprises a non-aromatic acrylate prepolymer and an aromatic acrylate prepolymer, and wherein the crosslinkable polymer precursor accounts for about 12-30 wt. % of the photoresin.

8. The method of claim 1, wherein the crosslinkable polymer precursor comprises polyethylene glycol diacrylate (PEGDA) and Bisphenol A ethoxylate (2 EO/phenol) dimethacrylate (BisA-EDMA).

9. The method of claim 1, wherein the catalyst comprises ammonium hydroxide.

10. The method of claim 1, wherein step (c) comprises curing the photoresin at a wavelength of 500 nm or less.

11. The method of claim 1, wherein step (e) comprises pyrolyzing in an inert environment at a temperature of 800° C. or more.

12. The method of claim 1, further comprising the step of (f) $CO_2$ etching the three-dimensional micro-architected aerogel.

13. A method for making a three-dimensional micro-architected aerogel, comprising:
   (a) curing a reaction mixture comprising a co-sol-gel material and at least one catalyst to obtain a crosslinked co-sol-gel;
   (b) providing a photoresin comprising a solvent, a photoinitiator, a crosslinkable polymer precursor, and a dispersion of the crosslinked co-sol-gel;
   (c) curing the photoresin using projection microstereolithography layer-by-layer to produce a wet gel having a pre-designed three-dimensional structure;
   (d) drying the wet gel to produce a dry gel; and
   (e) pyrolyzing the dry gel to produce a three-dimensional micro-architected aerogel,
   wherein step (b) comprises washing the crosslinked co-sol-gel by solvent exchange, dispersing the crosslinked co-sol-gel in the solvent by sonication, and adding the photoinitiator and the crosslinkable polymer precursor to the dispersion of the crosslinked co-sol-gel.

14. A method for making a three-dimensional micro-architected aerogel, comprising:
 (a) curing a reaction mixture comprising a co-sol-gel material and at least one catalyst to obtain a crosslinked co-sol-gel;
 (b) providing a photoresin comprising a solvent, a photoinitiator, a crosslinkable polymer precursor, and a dispersion of the crosslinked co-sol-gel;
 (c) curing the photoresin using projection microstereolithography layer-by-layer to produce a wet gel having a pre-designed three-dimensional structure;
 (d) drying the wet gel to produce a dry gel; and
 (e) pyrolyzing the dry gel to produce a three-dimensional micro-architected aerogel,
 wherein step (d) comprises solvent exchange, supercritical drying, and/or freeze drying.

* * * * *